United States Patent
Freitag et al.

(10) Patent No.: US 7,663,847 B2
(45) Date of Patent: *Feb. 16, 2010

(54) MAGNETORESISTIVE SENSOR HAVING AN ANISOTROPIC HARD BIAS WITHOUT A BUFFER LAYER

(75) Inventors: James Mac Freitag, Sunnyvale, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 556 days.

This patent is subject to a terminal disclaimer.

(21) Appl. No.: 11/200,788

(22) Filed: Aug. 9, 2005

(65) Prior Publication Data
US 2007/0035893 A1    Feb. 15, 2007

(51) Int. Cl.
*G11B 5/39* (2006.01)
(52) U.S. Cl. .............................. 360/324.12
(58) Field of Classification Search ............ 360/324.1, 360/324.11, 324.12, 324.2
See application file for complete search history.

(56) References Cited

U.S. PATENT DOCUMENTS

| | | | |
|---|---|---|---|
| 5,703,740 A * | 12/1997 | Cohen et al. | 360/125.35 |
| 6,599,401 B1 * | 7/2003 | Wang et al. | 204/192.2 |
| 7,061,728 B2 * | 6/2006 | Pinarbasi | 360/320 |
| 7,170,725 B1 * | 1/2007 | Zhou et al. | 360/324.11 |
| 7,189,583 B2 * | 3/2007 | Drewes | 438/3 |
| 7,446,987 B2 * | 11/2008 | Zhang et al. | 360/324.12 |
| 2002/0044393 A1 * | 4/2002 | Seigler et al. | 360/324 |
| 2004/0072036 A1 * | 4/2004 | Kubota et al. | 428/694 TS |
| 2005/0068697 A1 | 3/2005 | Pinarbasi | 360/324.12 |

FOREIGN PATENT DOCUMENTS

| CN | 99120900.1 | 5/2000 |
|---|---|---|
| CN | 2006/10109193 | 5/2007 |

* cited by examiner

*Primary Examiner*—Jefferson Evans
(74) *Attorney, Agent, or Firm*—Zilka-Kotab, PC

(57) ABSTRACT

A magnetoresistive sensor having magnetically anisotropic bias layers for biasing the free layer of the sensor. The hard magnetic layer is formed over a seed layer structure that has been treated to induce the magnetic anisotropy in the hard bias layers. The treated seed layers also allow the hard bias layers to be deposited over a crystalline material such as in a partial mill design, without the need for a buffer layer such as Si to break the epitaxial growth initiated by the underlying crystalline layer.

11 Claims, 8 Drawing Sheets

MAGNETORESISTIVE SENSOR HAVING AN ANISOTROPIC HARD BIAS WITHOUT A BUFFER LAYER

FIELD OF THE INVENTION

The present invention relates to free layer biasing in a magnetoresistive sensor, and more particularly to a magnetically anisotropic hard bias layer formed over a treated underlayer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos Θ, where Θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetic moment, when exchange coupled with a magnetic material, it can strongly pin the magnetization of the ferromagnetic layer.

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

As those skilled in the art will appreciate, the distance between the shields (gap thickness) determines the bit length for the read sensor. With the ever increasing pressure to increase data capacity and data rate, engineers are constantly under pressure to decrease the bit length (and therefore gap thickness) of read sensors. One way to decrease this gap thickness is by a partial mill process. Sensors have traditionally been constructed by depositing sensor layers as full film layers onto the first gap layer. A photoresist mask is then formed over the area that is to be the sensor and a material removal process such as ion milling is performed to remove material from the areas not covered by the mask. This material removal process has traditionally been performed down into the first gap layer, removing a portion of the first gap material at either side of the sensor.

Since this material removal process removes a portion of the first gap layer, it has been necessary to deposit a thick first gap layer in order prevent electrical shorts through the gap to the first shield. Such a short would be a catastrophic event that would render the sensor unusable. In these prior art heads, hard bias layers, constructed of a hard magnetic material such as CoPtCr have then been deposited over this etched out portion of the first gap layer at either side of the sensor to provide magnetic biasing to bias the magnetic moment of the free layer in the desired direction parallel with the ABS.

As discussed above, the removal of a portion of the first gap during formation of the sensor requires a larger overall gap thickness to prevent shorting. One way to overcome this is to use a partial mill process in which the material removal process (ie. ion milling) used to construct the sensor is terminated before all of the sensor material has been removed, such as when the material removal process has reached a point around the AFM layer (usually PtMn) near the bottom of the sensor.

By stopping the milling process within the sensor layers, such as at the AFM layer no gap material is removed. This allows a much thinner gap to be deposited. The bias layers are then deposited on top of the remaining sensor layer rather than on the gap layer.

A problem that arises from such partial milling is that the bias layer properties are different when deposited over the AFM layer or other sensor layer than they are when deposited over the gap layer. The gap layer, usually $Al_2O_3$ is amorphous. It therefore has no crystalline structure to impart to the seed layer or to the hard bias material when the material is deposited onto the gap. Therefore, a hard bias structure deposited over the amorphous gap layer can exhibit a desired epitaxial growth that provides desired high retentive moment and high coercivity needed for free layer biasing.

However, the AFM layer, such as for example PtMn, as well as other sensor layers are not amorphous and exhibit their own grain structures. When the hard bias layers are deposited over the AFM layer, the grain structure of the underlying AFM layer carries through to the seed layer and hard bias layers. This grain structure being undesirable for optimal hard bias properties results in degraded biasing properties. This leads to free layer instability and associated signal noise. For example, depositing a CoPtCr hard magnetic material with a Cr seed layer over a PtMn substrate results in a CoPtCr hard bias layer with a coercivity of only around 600 Oe. This is much lower than the roughly 1400 Oe coercivity obtained when the same hard bias layer and seed are deposited on a glass (amorphous) substrate.

Another problem that exists with presently used seed layers is that such seed layers, for example those containing Ta, tend to oxidize. Since the seed layers are exposed at the ABS they experience exposure to atmospheric elements during use and to certain corrosive environments during manufacture, such as during lapping. Oxidation of the seed layers results in increased resistance between the hard bias layer and the sensor as well as between the leads and the sensor. This increased resistance decreases sensor performance.

Another problem the arises in magnetoresistive sensors is that as the size of the sensor shrinks, the area of the sensor adjacent to the bias layer decreases resulting in weak biasing. In addition, the size of the hard bias decreases accordingly. The smaller hard bias layer becomes magnetically un-stable and prone to loss of bias moment. In fact sensors are rapidly becoming so small that current hard biasing structures will not provide adequately robust biasing to ensure stable sensor performance.

Therefore there is a strong felt need for a hard bias structure that can be formed over an AFM material or other sensor material while still exhibiting the necessary hard magnetic properties needed for effective free layer biasing. Such a bias structure would preferably allow a hard bias layer such as one containing Co, Pt and Cr to be applied over an AFM layer such as PtMn whithout the hard bias layer taking on the undesirable grain structure of the underlying AFM layer. Such a bias layer would preferably also have increased bias moment stability to prevent loss of magnetic moment orientation in a very small sensor.

SUMMARY OF THE INVENTION

The present invention provides magnetoresistive sensor having an anisotropic hard bias structure for free layer biasing. The sensor includes an underlayer and a seed layer formed over the underlayer. The seed layer is formed with an anisotropic roughness that induces a magnetic anisotropy in a bias layer formed there over.

The bias structure may include first and second seed layers, the first seed layer having a surface that has been treated with the anisotropic roughness and the second seed layer being formed over the first seed layer. The first and second seed layers may be CrMo.

The surface treatement may be formed on the seed layer by exposing the surface of the seed layer to a low power ion mill performed at an oblique angle with respect to the surface of the seed layer. The ion mill may be performed using 9 zone ion extraction grid.

The surface treatment of the seed layer provides several advantages. It causes the hard bias layer, deposited there over to have a magnetic anisotropy which makes the free layer biasing exceptionally stable even in a very small sensor. The surface treatment also causes the bias layer to have excellent magnetic properties, including high coercivity and squareness, even when the seed layer and hard bias layers are formed over a crystalline structure such as in a partial mill design. Furthermore, it ensures these magnetic properties without the need for a buffer layer such as a Si or Cr layer which would otherwise have to be interspersed in the seed layer.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
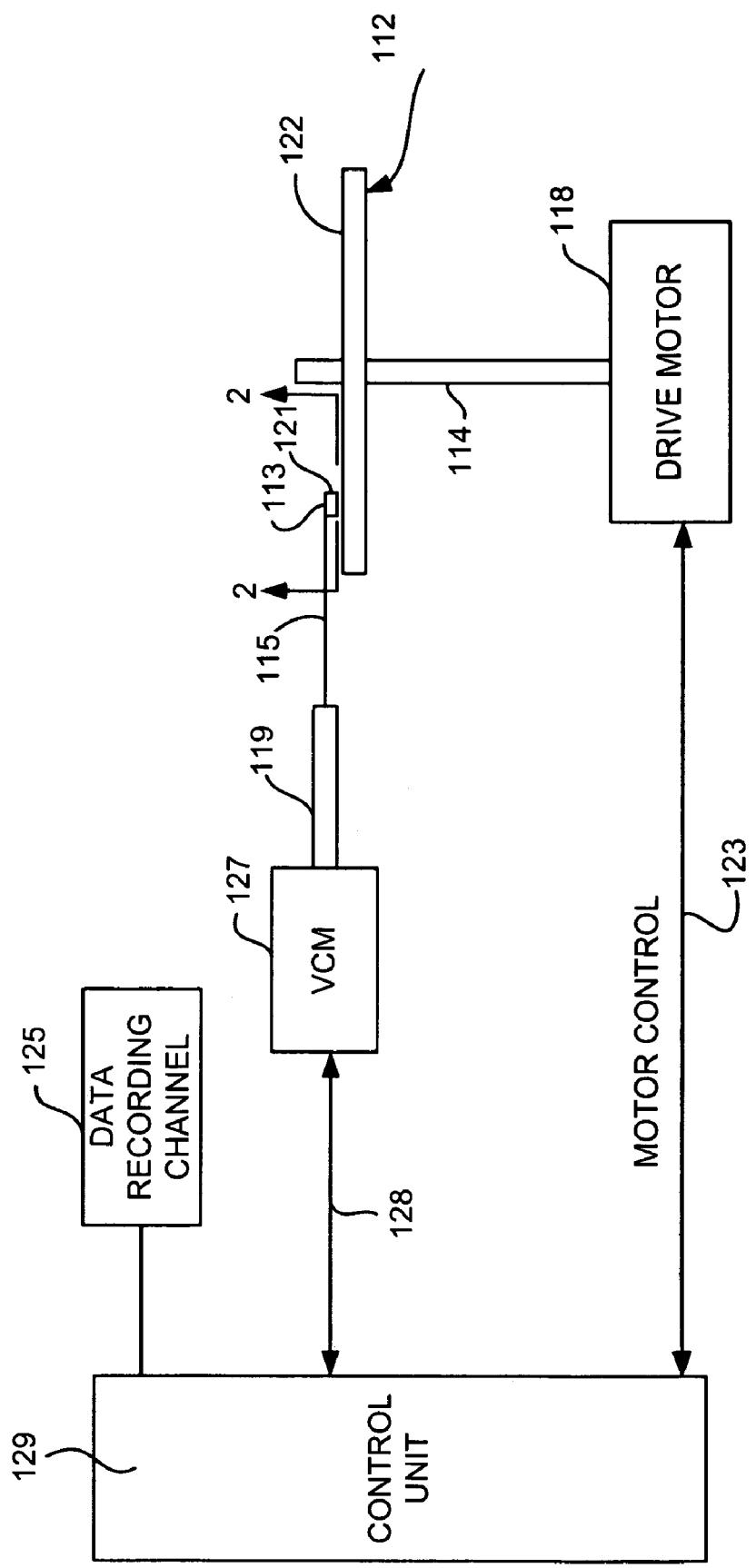
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
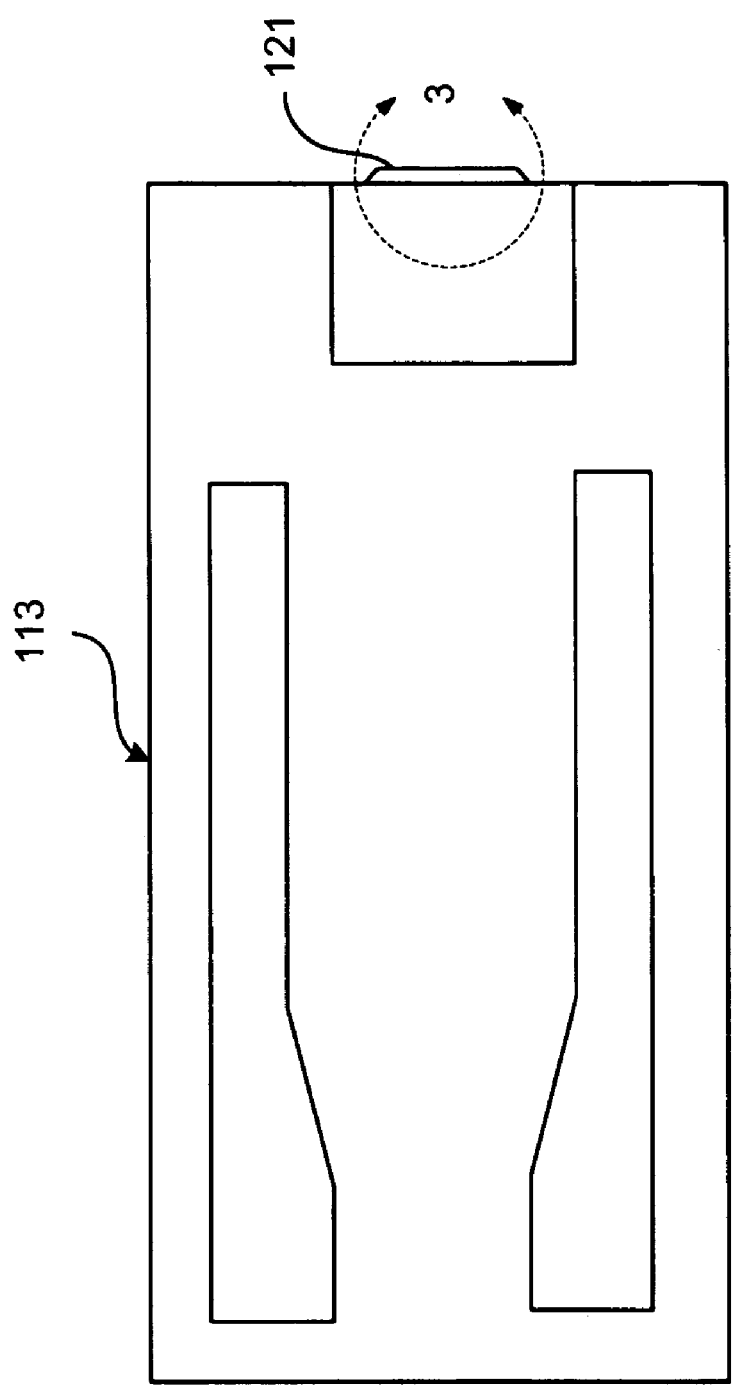
FIG. 2 is an ABS view of a slider, taken from line 3-3 of FIG. 2, illustrating the location of a magnetic head thereon.
Figure 3:
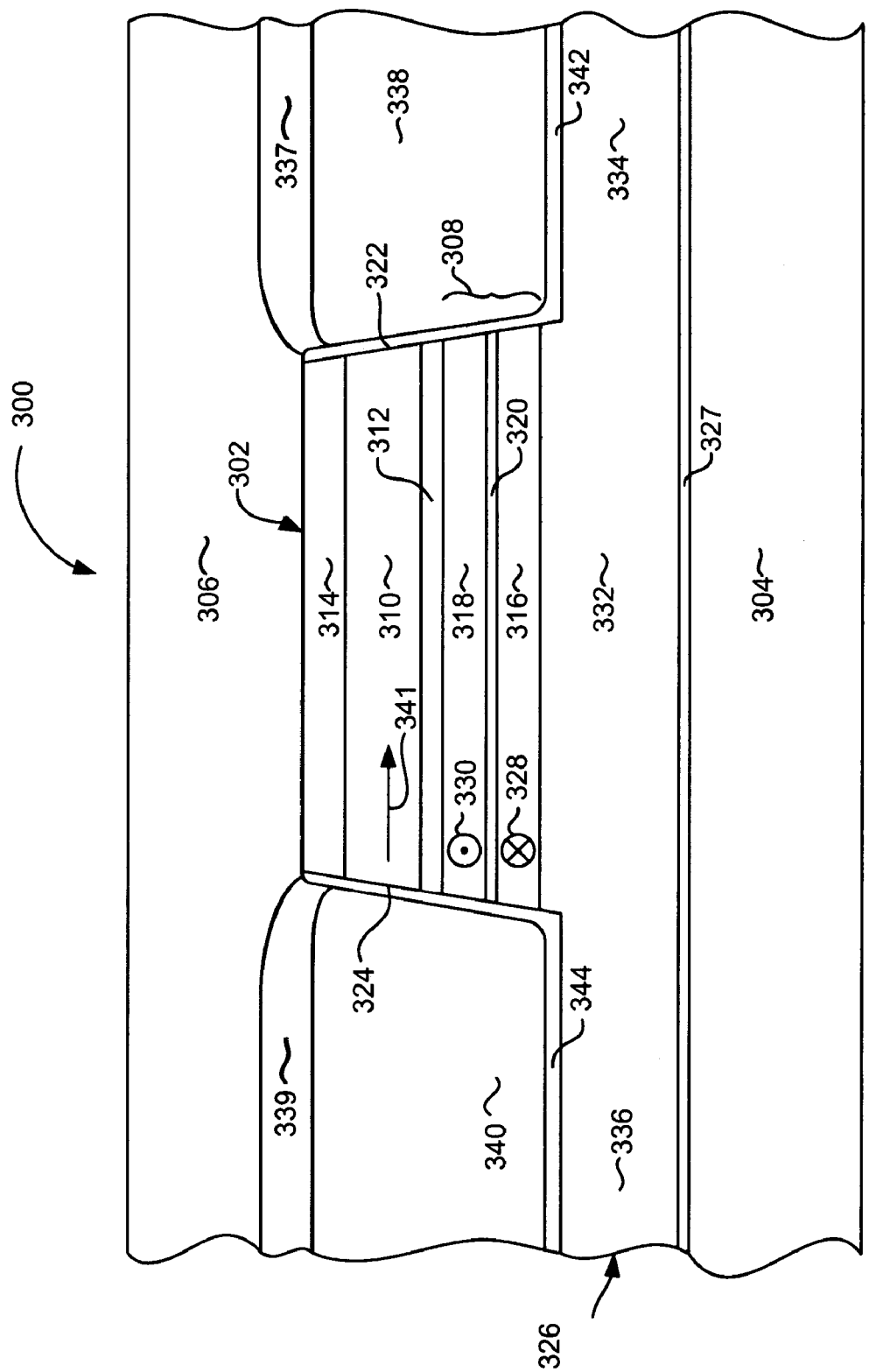
FIG. 3 is an ABS view of a magnetic sensor according to an embodiment of the present invention taken from circle 3 of FIG. 2.

With reference to FIG. 2, the orientation of the magnetic head 121 in a slider 113 can be seen in more detail. FIG. 3 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

With reference now to FIG. 3, a magnetoresistive sensor 300 according to an embodiment of the invention includes sensor stack 302 sandwiched between first and second gap layers 304, 306. The sensor stack 302 includes a magnetic pinned layer structure 308 and a magnetic free layer 310. A non-magnetic, electrically conductive spacer layer 312, such as Cu, is sandwiched between the free layer 310 and the pinned layer structure 308. A capping layer 314, such as Ta, may be provided at the top of the sensor stack 302 to protect the sensor from damage during manufacturing, such as from corrosion during subsequent annealing processes.

The pinned layer 308 can be a simple pinned structure or an antiparallel (AP) pinned structure and is preferably an AP pinned structure including first and second magnetic layers (AP1) 316, and (AP2) 318 which may be for example CoFe antiparallel coupled across a thin AP coupling layer 320 such as Ru. The free layer 310 can be constructed of various magnetic materials such as NiFe or CoFe, and may include layers of CoFe and NiFe, preferably with a layer of CoFe or Co adjacent to the spacer 312 for optimal sensor performance.

As can be seen with reference to FIG. 3, the sensor stack 302 has first and second laterally opposed side walls 322, 324 that define the track-width or active area of the sensor. A layer of antiferromagnetic material (AFM) 326, preferably PtMn, formed at the bottom of the sensor stack 302 is exchange coupled with the AP1 layer 316. The AFM layer when exchange coupled with the AP1 layer 316 strongly pins the magnetic moment of the AP1 layer 316 as indicated by arrowhead 328. This in turn strongly pins the moment 330 of the AP2 layer 318 by antiparallel exchange coupling across the AP coupling layer 320. Also as can be seen, the AFM layer 326 has a portion 332 that is disposed within the track width or active area of the sensor 300, but also has first and second laterally extending portions 334, 336 that extend laterally outward beyond the active area of the sensor 300.

The AFM layer 326 may be formed on a seed layer 327 constructed of a material that is chosen to initiate a desired crystallographic structure in the AFM layer 326. The laterally extending portions 334, 336 may be slightly thinner than the inner portion 332 due to a partial milling process used to construct the sensor 300. It should be pointed out other sensor layers, such as the pinned layer 308 or spacer 312 could also extend beyond the active area of the sensor 300 as well. The extension of the AFM layer 326 alone is by way of example only. Alternatively, the partial mill process could be performed sufficiently to remove the AFM layer 326 outside of the sensor area, leaving just the seed layer 327 extending beyond laterally outward.

With continued reference to FIG. 3, the sensor 300 includes first and second hard magnetic, bias layers (HB layers) 338, 340. In addition, first and second leads 337, 339 are formed over the HB layers 338, 340. The leads 337, 339 may be constructed of, for example, Ta, Au, Rh or some other electrically conducting material. The HB layers 338, 340 are preferably constructed of an alloy containing Co, Pt and Cr, more specifically $Co_{80}Pt_{12}Cr_8$. The hard bias layers 338, 340 have a high magnetic coercivity, and are magnetostatically coupled with the free layer 310 to bias the magnetic moment of the free layer 310 in a direction parallel with the ABS as indicated by arrow 341.

Seed layers 342, 344 are provided beneath the HB layers 338, 340. The seed layers 342, 344 preferably extend over the laterally extending portions 334, 336 of the AFM layer as well as over the side walls 322, 324 of the sensor stack 302.

Figure 4:
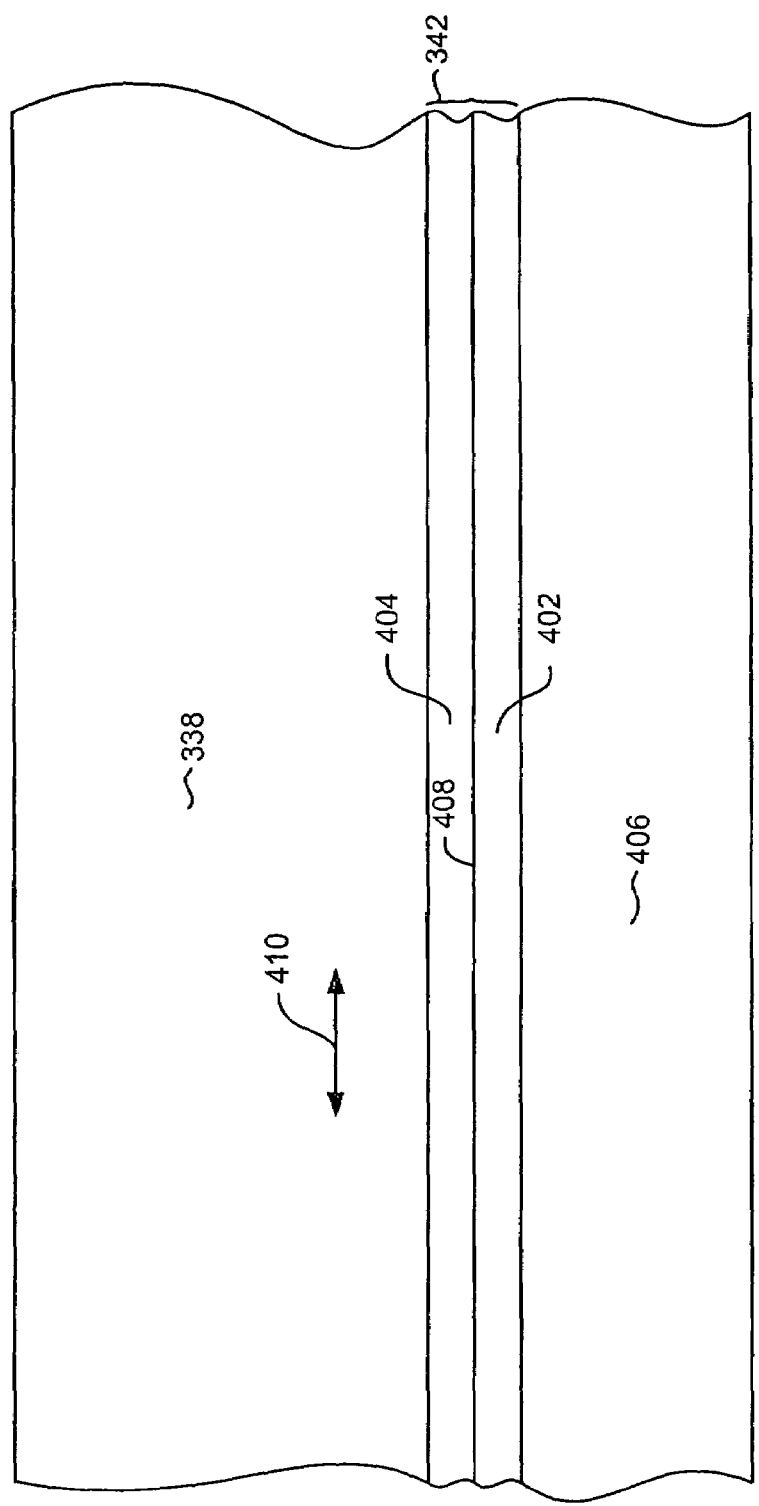
FIG. 4 is an expanded cross sectional view of a seed layer for use in the present invention.

FIG. 4, illustrates in greater detail the structures of the seed layers 342, 344 and hard bias layers 338, 340 previously described with reference to FIG. 3. Although only one seed layer 342 is shown, it should be understood that the structure described applies to both seed layers 342, 344 and hard bias layers 338, 340. The seed layer structure 342 includes first and second seed sub-layers which will be referred to as first and second seed layers 402, 404, formed upon a substrate 406. The substrate can be the AFM layer 332, (FIG. 3) or could be some other substrate such as a portion of the pinned layer structure 308, spacer layer 312 or even the AFM seed layer 327 or underlying gap layer 304.

The first seed layer 402 comprises a crystalline material such as CrMo. The first seed layer 402 has an upper surface 408 that has been treated by a process that will be described in greater detail herein below. The surface treatment results in an anisotropic surface texture that produces a magnetic anisotropy 410 in the hard bias layer 338. The second seed layer 404 is deposited on top of this treated surface 408 of the first seed layer, and may also be CrMo.

The anisotropic roughness of the surface 408 of the first seed layer 402 produces a strong magnetic anisotropy in the hard bias layer, even with a second seed layer 404 disposed between the first seed layer 402 and the hard bias layer 338. The surface texture also advantageously results in a high magnetic coercivity and high squareness in the hard bias layer 338. This combination of magnetic anisotropy, high coercivity, and high squareness in the hard bias layers 338, 340 result in exceptionally robust free layer biasing, even in a very small sensor.

Another advantage of the above described seed layer structure is that it allows the hard bias have desirable magnetic properties (high squareness and coercivity) even when deposited over a crystalline structure. Furthermore, this is possible without the need for a buffer layer, such as a Si or SiCrMo layer. As discussed above with regard to the Background of the Invention, when hard bias layers are deposited over crystalline layers, such as in a partial mill design, the crystal structure of the hard bias layer is affected by the underlying grain structure resulting in degraded magnetic properties in the hard bias layer. One way to prevent the hard bias layers from being negatively affected by the underlying crystal structure would be to interpose a buffer layer into the seed layer structure. The seed layer structure of the present invention, however, mitigates the effects of the underlying the crystal material, ensuring excellent magnetic properties in the hard bias layer without the need for such a buffer layer.

Optionally, according to an alternate embodiment of the invention, the seed layer structure 342 could consist of a single layer (such as CrMo) that has a surface treated as described above. In this case, the treated surface 408 would be in direct contact with the hard bias layer 338. According to still another embodiment off the invention, the seed layer 342 could be eliminated altogether, and the surface of the substrate 406 itself could be treated to have an anisotropic roughness. The substrate 406 could be the AFM layer 334, pinned layer 308, spacer 312, or could even be the AFM seed layer 327 or gap layer 304.

Figure 5:
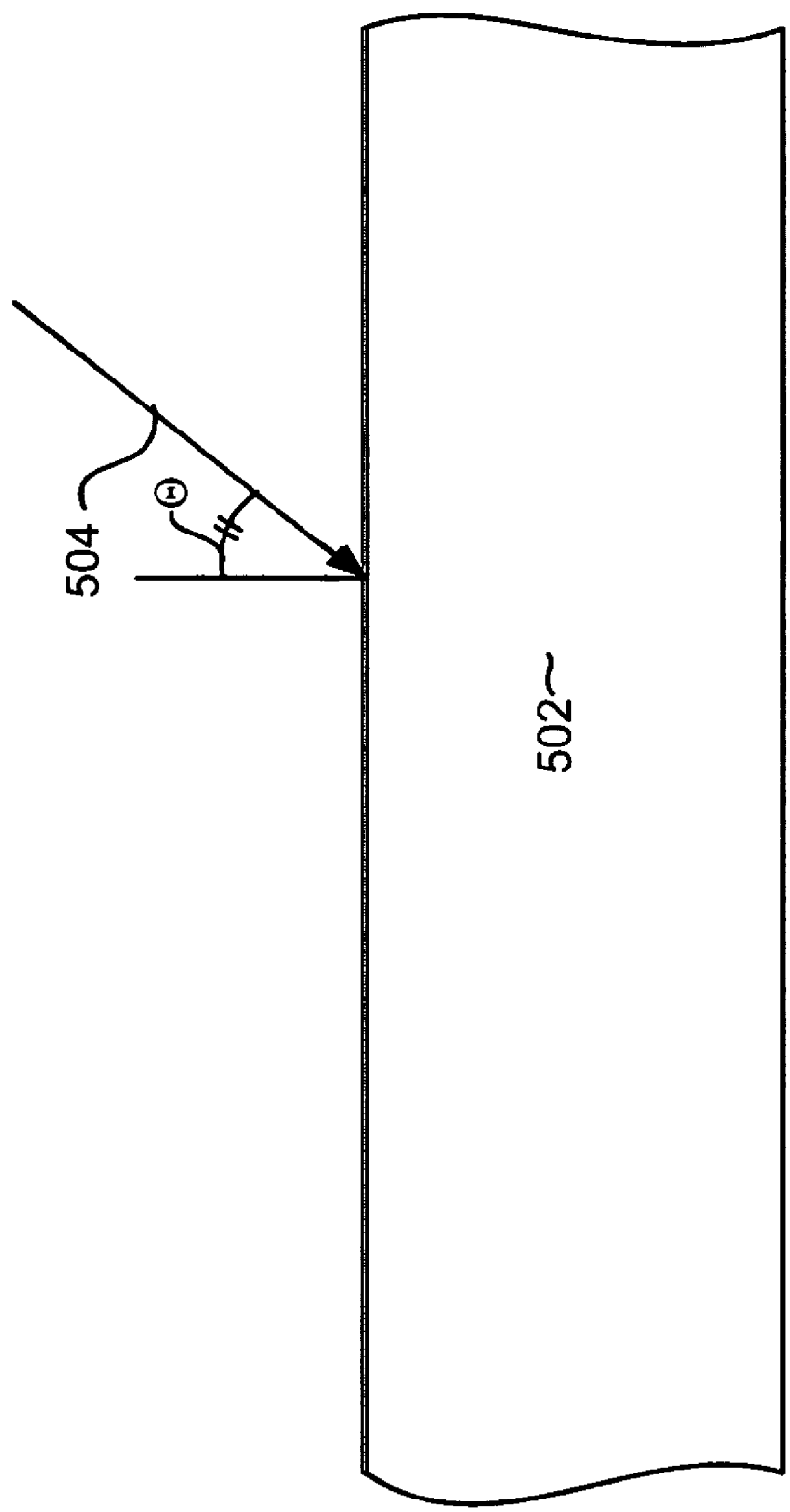
FIG. 5-7 are views illustrating a method of treating a surface with an anisotropic roughness.
Figure 6:
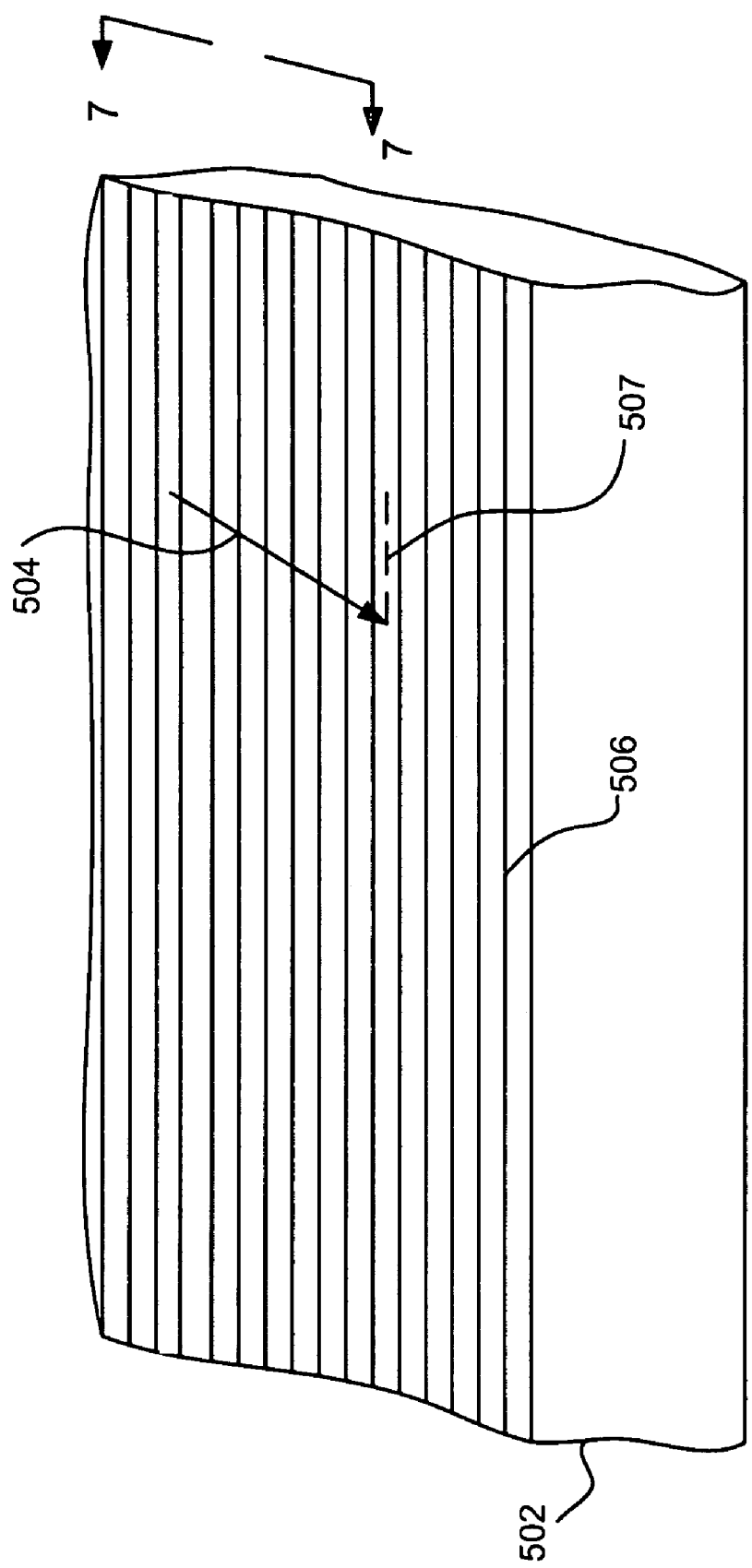
Figure 7:
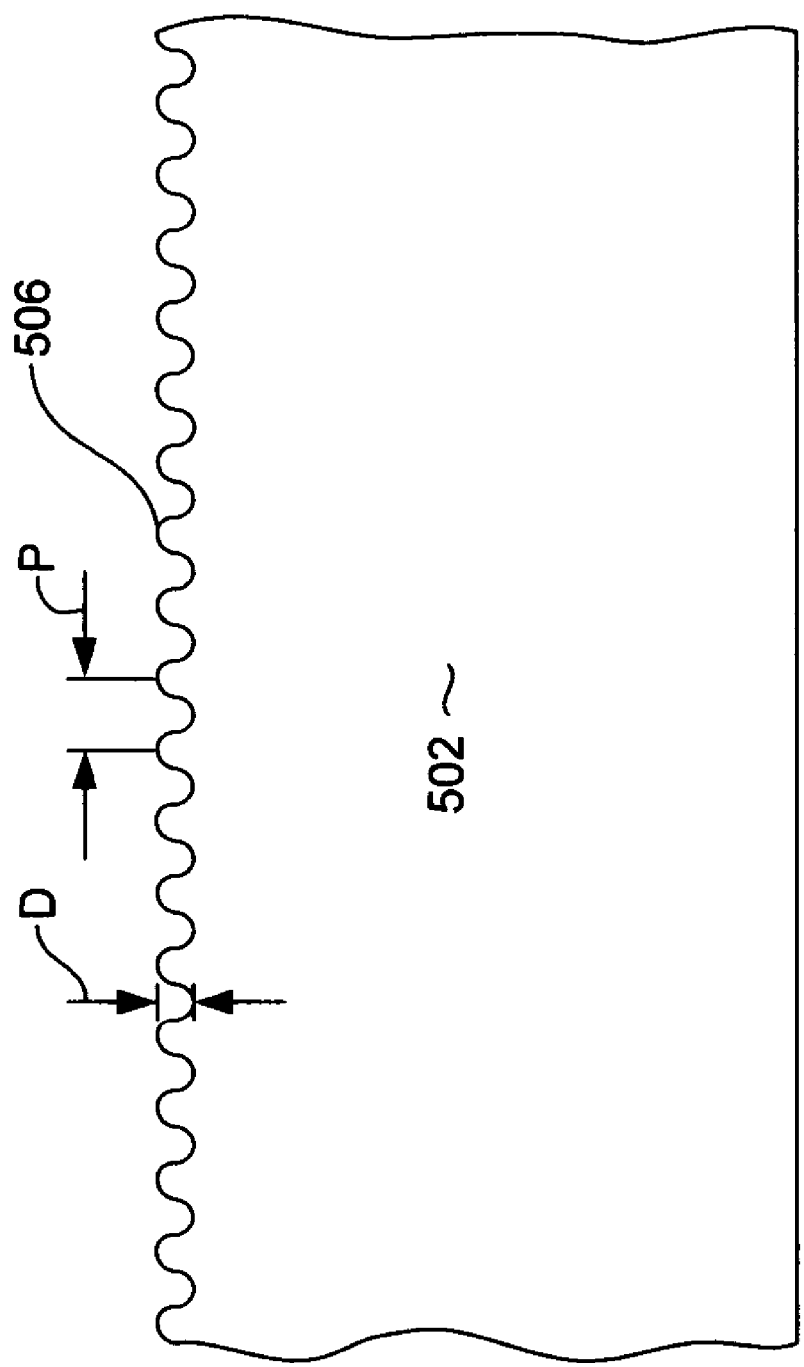

With reference to FIGS. 5-7, the surface treatment used to form an anisotropic roughness on the surface 408 (FIG. 4) of the seed layer 402 (or other layer) will be described in greater detail. With particular reference to FIG. 5, a surface treated layer such as the seed sub-layer 402, substrate 406, or second seed sub-layer 404 is constructed by depositing a material 502, which could be for example CrMo, or some other suitable, preferably crystalline, material. For purposes of illustration, the treated layer 502 will be referred to as seed layer 502. A low power ion mill 504 is then performed at an angle Θ with respect to a normal to the surface of the seed layer 502. The ion mill 504 is preferably performed using a 9 zone ion extraction grid, and is performed at a voltage of 20-300 Volts or about 50 Volts. The seed layer material 502 can be for example 30 to 300 Angstroms or about 100 Angstroms thick after ion mill.

The angled ion mill induces anisotropic roughness for example in form of oriented ripples or facets 506 which can be seen with reference to FIGS. 6 and 7. The typical or average pitch P of the ripples 506 may be between about 1-200 nm, their average depth D may be between approximately 0.2 to 5 nm or about 0.5 nm. Although shown as uniform ripples in FIGS. 6 and 7, this is for purposes of illustration. The actual surface would more likely be in the form of a more random and irregular surface roughness that is generally oriented and configured as described. After the angled ion etch 504 has been performed sufficiently to form the desired ripples or facets 506, the second seed layer 502 (FIG. 4) may be deposited. The hard bias layer 338 (FIG. 4) may then be formed by depositing high coercivity magnetic material such as, for example CoPt or CoPtCr. The magnetic easy axis 410 of the applied hard bias layer 338 will be substantially perpendicular to the in plane projection 407 (FIG. 6) of the angled ion etch onto the surface of the seed layer 502. Under certain manufacturing conditions, the magnetic easy axis may be either substantially parallel or substantially perpendicular to the in-plane projection 507 of the angled ion etch. The ion etch direction must be chosen such that the resulting magnetic easy axis of the hard magnetic bias layers is substantially parallel to the ABS.

The angled ion etch 504 is preferably performed at an angle Θ of between 30 and 80 degrees and is more preferably performed at an angle of between 35 and 65 degrees with respect to the normal to the surface of the seed layer 502. The exact voltage, current, and angle conditions depend on the type and characteristics of the ion source in use.

It should be pointed out that, although the above discussed embodiments describe the invention in terms of a partial mill sensor design having a hard bias formed on the crystalline layers of the AFM or other sensor materials, the invention could also be embodied in a full mill design, wherein the hard bias materials are deposited over the amorphous gap layer. The present invention however provides advantages when used in a partial mill design, because the treated seed layer provides improved magnetic properties in the hard bias layer. Obtaining good magnetic properties in a hard bias structure formed over a crystalline material such as an AFM material is difficult, because the crystalline structure of the hard bias layer is affected by the underlying crystalline structure. The treated seed layer of the present invention, however, produces excellent magnetic properties in the hard bias layer even if it is formed over such a crystalline material.

Figure 8:
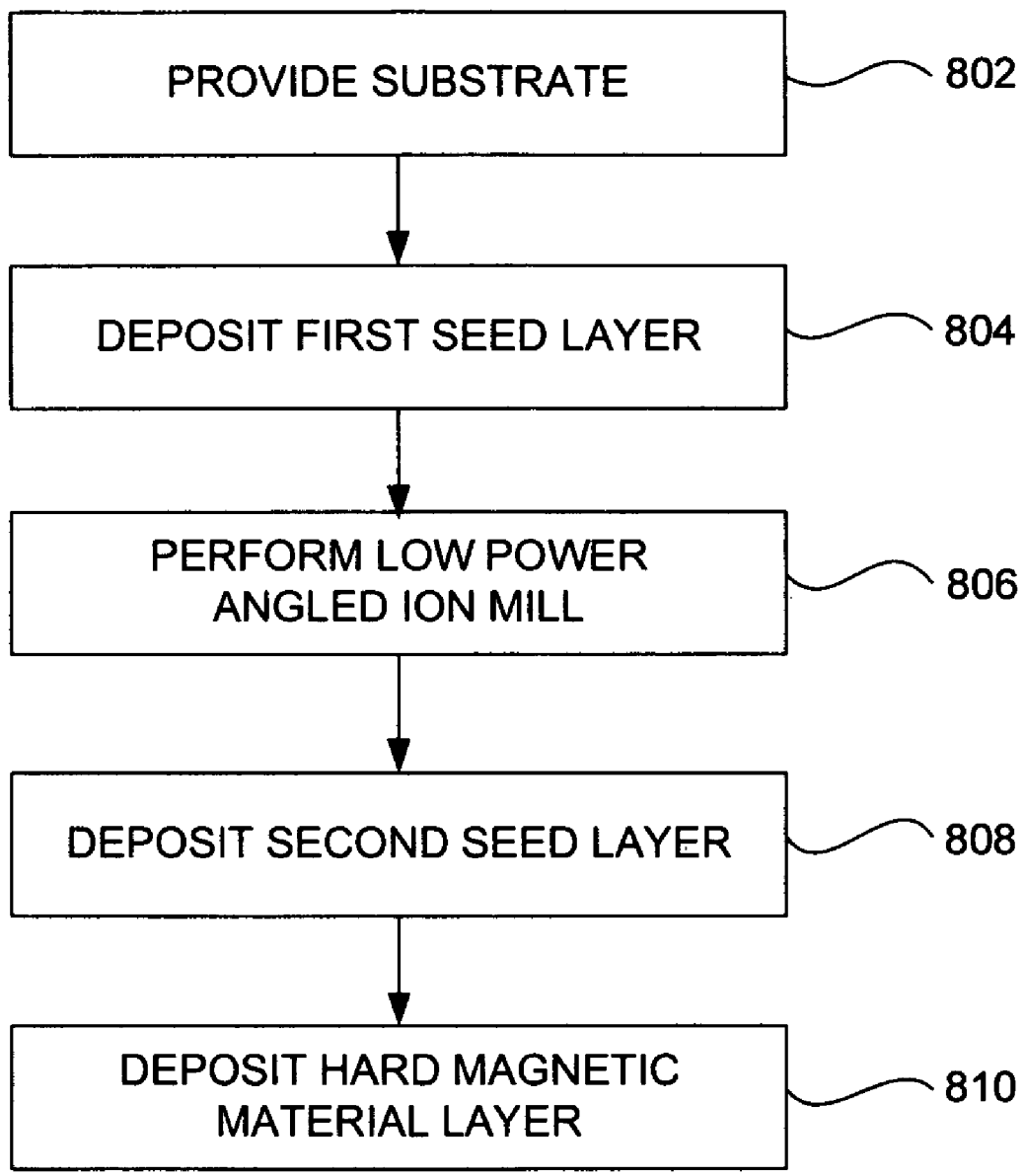
FIG. 8 is a flowchart illustrating a method of constructing a magnetoresistive sensor according to an embodiment of the invention.

With reference to FIG. 8, a method for constructing a magnetoresistive sensor according to an embodiment of the invention is illustrated. First, in a step 802, a substrate is provided. The substrate can be, for example a portion of one of the sensor layers remaining in the inactive portion of the sensor after definition of the sensor (ie. after milling to define the track width and/or stripe height). For, example, the substrate could be a portion of the AFM layer 326 used to pin the pinned layer, or could be a portion of the pinned layer structure 308. In a full mill sensor design, the substrate could be the underlying gap layer 304. Then, in a step 804, a first seed layer 402 is deposited. This seed layer 402 is preferably a crystalline material, and can be CrMo. Then, in a step 806, a low powered ion mill is performed on a stationary chuck (ie. the chuck does not rotate). This angled ion mill can be performed at a voltage of 20-300 V or about 50 V. The ion mill can be performed at an angle of 20-80 degrees, or more preferably between 35 and 65 degrees with respect to a normal to the surface of the seed layer. The seed layer 402 may have a thickness of 30 to 300 Angstroms or about 100 Angstroms after this angled ion mill. Then, in a step 808 a second seed layer 404 can be deposited. This second seed layer can be constructed of, for example CrMo. Then, in a step 810, a layer or hard magnetic material (hard bias layers 338, 340), such as for example an alloy containing one or all of Co, Pt, and/or Cr. The hard magnetic material could be $Co_{80}Pt_{12}Cr_8$. Optionally, the seed layer structure may include only a single layer of seed layer in which case the step 808 could be eliminated.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   an underlayer;
   a seed layer having a surface configured with an anisotropic roughness, the seed layer being a crystalline material; and a hard magnetic material formed over the seed layer wherein the underlayer is an antiferromagnetic material.

2. A magnetoresistive sensor, comprising:

an underlayer;

a seed layer having a surface configured with an anisotropic roughness, the seed layer being a crystalline material; and a hard magnetic material formed over the seed layer wherein the anisotropic roughness comprises ripples that extend along a direction substantially perpendicular to an air bearing surface of the sensor.

3. A magnetoresistive sensor as in claim 2 wherein the underlayer is an amorphous, electrically insulating, non-magnetic gap layer.

4. A magnetoresistive sensor as in claim 2 wherein the anisotropic roughness induces a magnetic anisotropy in the hard magnetic material.

5. A magnetoresistive sensor comprising:

an underlayer;

a first seed layer formed on the under-layer, the first seed layer having an anisotropic roughness;

a second seed layer formed on the first seed layer; and a layer of hard magnetic material formed over the second seed layer;

wherein the first and second seed layers each comprise CrMo.

6. A magnetoresistive sensor as in claim 5 wherein the anisotropic roughness is configured to induce a magnetic anisotropy in the layer of hard magnetic material.

7. A magnetoresistive sensor as in claim 5 wherein the first and second seed layers each comprise CrMo and the hard magnetic material comprises CoPtCr.

8. A magnetoresistive sensor as in claim 5 wherein the first and second seed layers each comprise CrMo and the hard magnetic material comprises CoPt.

9. A magnetoresistive sensor, comprising:

a sensor stack having first and second laterally opposed sides; and first and second hard bias structures extending from the first and second sides of the sensor stack, each hard bias structure comprising a seed layer having a surface configured with an anisotropic roughness, and a hard magnetic material layer formed over the seed layer wherein the anisotropic roughness comprises ripples having an average depth of 0.2-5 nm.

10. A magnetoresistive sensor, comprising:

a sensor stack having first and second laterally opposed sides; and first and second hard bias structures extending from the first and second sides of the sensor stack, each hard bias structure comprising a first seed layer having a surface configured with an anistotropic roughness, a second seed layer formed over the first seed layer, and a hard magnetic material layer formed over the second seed layer, wherein the first and second seed layers each comprise CrMo.

11. A sensor as in claim 9 wherein the seed layer comprises CrMo.

* * * * *